(12) United States Patent
Hsu et al.

(10) Patent No.: US 7,872,277 B2
(45) Date of Patent: Jan. 18, 2011

(54) LIGHT EMITTING DIODE DEVICE

(75) Inventors: Chin-Yuan Hsu, Kaohsiung (TW);
Chia-Hsien Chang, Changhua County (TW); Szu-Wei Huang, Tucheng (TW)

(73) Assignee: Everlight Electronics Co., Ltd., Tu Chen, Taipei Hsien (TW)

( * ) Notice: Subject to any disclaimer, the term of this patent is extended or adjusted under 35 U.S.C. 154(b) by 0 days.

(21) Appl. No.: 11/932,588

(22) Filed: Oct. 31, 2007

(65) Prior Publication Data

US 2009/0026484 A1    Jan. 29, 2009

(30) Foreign Application Priority Data

Jul. 25, 2007   (TW) .............................. 96127147 A

(51) Int. Cl.
*H01L 33/00* (2010.01)
(52) U.S. Cl. ............................. 257/99; 257/79; 257/690; 257/787
(58) Field of Classification Search .................... 257/79, 257/99, 690, 787
See application file for complete search history.

(56) References Cited

U.S. PATENT DOCUMENTS

2007/0126115 A1* 6/2007 Yanagihara et al. ......... 257/712
2007/0138484 A1* 6/2007 Yamamoto et al. ............ 257/79
2007/0145393 A1* 6/2007 Darbinian et al. ............. 257/98

FOREIGN PATENT DOCUMENTS

| CN | 1545148 A | 11/2004 |
| CN | 2739803 Y | 11/2005 |
| JP | 7-86640 A | 3/1995 |
| JP | 11-68237 A | 3/1999 |
| JP | P2000-150969 A | 5/2000 |
| JP | P2006-93672 A | 4/2006 |
| JP | P2006-352052 A | 12/2006 |
| JP | U3130587 U | 4/2007 |

* cited by examiner

*Primary Examiner*—Long Pham
(74) *Attorney, Agent, or Firm*—Pai Patent & Trademark Law Firm; Chao-Chang David Pai

(57) ABSTRACT

A light emitting diode device is disclosed, and the light emitting diode device includes a base, a substrate, a lead frame, a chip, a first mixed layer and a second mixed layer. The first mixed layer and the second mixed layer respectively contain a glue and a thermal conductance insulating material, such as diamond carbon, diamond-like carbon or ceramic. The substrate and the lead frame are set on the base. The first mixed layer is formed between the chip and the substrate to fix the chip and strengthen heat dissipation. The second mixed layer is covered on the substrate and the chip to reduce the difference of the refraction index such that the total internal reflection angle is wider and the emitting efficiency is enhanced.

9 Claims, 5 Drawing Sheets

LIGHT EMITTING DIODE DEVICE

BACKGROUND

1. Field of Invention

The present invention relates to a light emitting diode, and more particularly to the light emitting diode package structure with a mixture of glue.

2. Description of Related Art

Light emitting diodes have high reaction speeds, smaller volumes, lower power consumption, less heat radiation and extended lifetimes and have therefore gradually replaced conventional incandescent or halogen lamps. Applications for light emitting diodes, like the indication light for electronic apparatus, the back light source of the liquid crystal display (LCD) and the illuminator, are continually being extended as technology progresses.

As LED illumination and efficiency increases, the packaging process faces two major challenges, heat dissipation and optical characteristic. Regarding heat dissipation, high power light emitting diode generates simultaneously lots of light beams and heat. The heat needs to be dissipated quickly and efficiently. Otherwise, the accumulated heat results in high temperature that diminishes the illumination and shortens the lifetime. In another aspect for optical characteristic, the light emitting diode typically uses epoxy resin to package the die. High temperature and ultraviolet irradiation affects the optical characteristics of the epoxy resin. Consequently, optical transparency is gradually decreased with the extended usage period and the refraction index is therefore lessened.

In conventional packaging process for LEDs, the auto-encapsulating step or molding step proceeds after the die bonding step and the wire-bonding step. General die bonding processes use silver paste or transparent insulating paste to mount the chip on the substrate such that the heat generated from the chip is conducted to the substrate or heat sink of the package through the silver paste or transparent insulating paste. However, the silver paste and transparent insulating paste cannot bear such voluminous heat conduction caused by the raised power and temperature of the light emitting diode device. In this way, the optical deterioration and heat deterioration result in light emitting diode device failure.

Moreover, the composed material of the light emitting diode and laser diode have a refraction index larger than 2.5, and the conventional gel or resin has a refraction less than 1.5. Therefore, the large difference between the chips and the composed material decreases the light emitting efficiency because of the lower total internal reflection angle of the emitted light from the chip after packaging.

In addition to primitive characteristics of mechanical strength and heat dissipation efficiency, the optical characteristic of the composed material should be considered in order to satisfy the current requirement for light emitting diode package structures.

SUMMARY

It is therefore an aspect to provide a light emitting diode device to provide an LED chip with an adhesive and a heat dissipation effect simultaneously through a mixture of glue and thermal conductance insulating material.

It is therefore another aspect to provide a light emitting diode device, and the light emitting diode device is packaged by a glue mixture. The refraction index of the mixture is higher than the refraction index of conventional gel to widen the total internal reflection angle and enhance the light emitting efficiency.

In accordance with an embodiment of the present invention, the light emitting diode device includes a base, a substrate, a lead frame, an LED chip, a first mixed layer and a second mixed layer.

The substrate and the lead frame are set on the base, and the first mixed layer is formed between the LED chip and the substrate whereby the LED chip is secured on the substrate. Wires connect the LED chip to the lead frame. The wires provide electrical conductance for illumination. The second mixed layer injected into the base covers the substrate, the LED chip and the wires.

The first mixed layer and the second mixed layer contain a glue and a thermal conductance insulating material wherein the glue may be an epoxy resin, a silicone resin or poly carbonate, and the thermal conductance insulating material may be a diamond carbon, a diamond-like carbon or a ceramic. The mixed layers include not only adhesive features but also greater thermal conductance and electric insulation than conventional packaging gel.

The first mixed layer is formed between the substrate and the LED chip whereby the LED chip is secured on the substrate by the adhesive feature. In addition, the thermal conductance enables heat radiated from the LED chip to be transferred through the substrate to the base from which the heat is dissipated. Compared with the conventional silver paste or transparent insulating paste with only adhesive feature, the heat dissipation efficiency is raised through the first mixed layer.

Moreover, the LED chip illuminates upward wherein the refraction index thereof is larger than 2.5, and the refraction index of the second mixed layer is about between 1.5 and 2.5. Compared with the refraction index of conventional packaging gel less than 1.5, the difference between the LED chip and the packaging material is decreased to widen the total internal reflection angle and enhance the light emitting efficiency.

Compared with conventional light emitting diode device, the light emitting diode device of the present invention has the following effects:

1. The mixed layers in the present invention are made of glue and thermal conductance insulating material to substitute for silver paste or transparent insulating paste to secure the LED chip on the substrate. In addition, the heat radiated from the LED chip is transferred through the substrate to the base with greater heat dissipation characteristics because of the thermal conductance of the mixed layers.

2. The refraction index of the mixed layers of the present invention is about between 1.5 and 2.5, and the refraction index of the LED chip is larger than 2.5. Compared with the refraction index of conventional packaging gel less than 1.5, the difference between the LED chip and the packaging material is decreased to widen the total internal reflection angle and enhance the light emitting efficiency.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
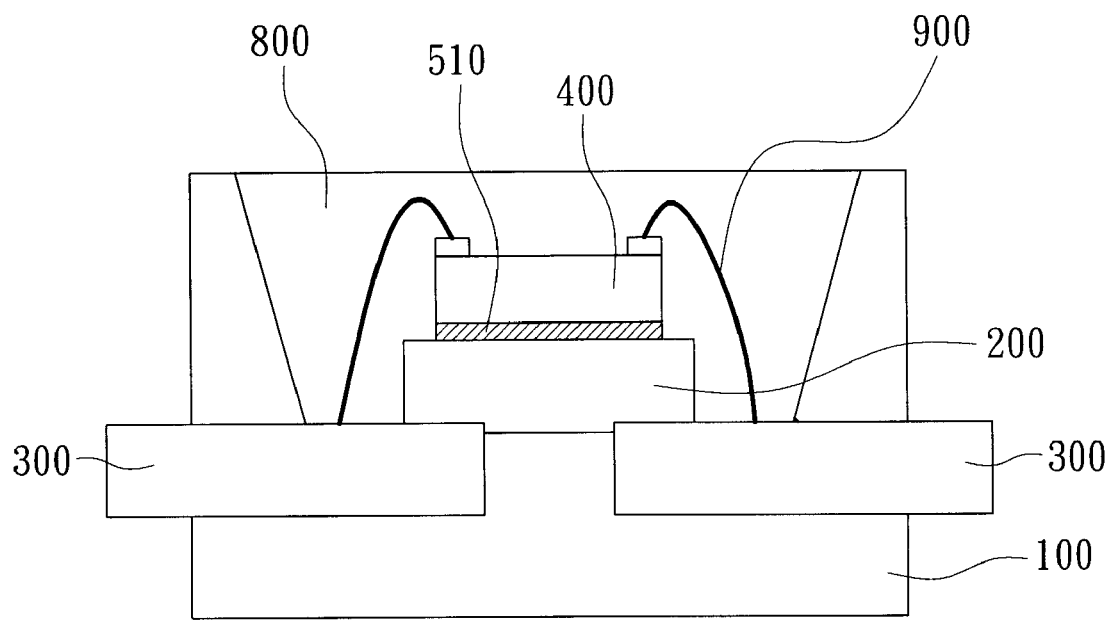
FIG. 1 is a structure view of a light emitting diode device of the first embodiment in accordance with the present invention.

Reference will now be made in detail to the present preferred embodiments of the invention, examples of which are illustrated in the accompanying drawings. Wherever possible, the same reference numbers are used in the drawings and the description to refer to the same or like parts.

While the specification concludes with claims defining the features of the invention that are regarded as novel, it is believed that the invention will be better understood from a consideration of the following description in conjunction with the figures, in which like reference numerals are carried forward.

Refer to FIG. 1. FIG. 1 illustrates a structure view of a light emitting diode device of the first embodiment in accordance with the present invention. The light emitting diode device of the first embodiment includes a base 100, a substrate 200, a lead frame 300, an LED chip 400, a first mixed layer 510 and a packaging gel 800.

The substrate 200 and the lead frame 300 are set on the base 100, and the first mixed layer 510 is formed between the LED chip 400 and the substrate 200 whereby the LED chip 400 is mounted on the substrate 200. The LED chip 400 is connected with the lead frame 300 by wires 900 to provide electric conductance for upward illumination (face up type). The packaging gel 800 is injected in the base 100 to cover the substrate 200, the LED chip 400 and the wires 900.

The first mixed layer 510 comprises a glue and a thermal conductance insulating material wherein the glue may be an epoxy resin, a silicone resin or poly carbonate, and the thermal conductance insulating material may be a diamond carbon, a diamond-like carbon or a ceramic. The ceramic may be alumina, aluminum nitride, boron nitride or silicon carbide. The thermal conductivity of the diamond carbon and the diamond-like carbon is larger than 1000 W/mk, and the thermal conductivity of the ceramic is larger than 200 W/mk. Therefore, the mixed glue includes not only adhesive features but also higher thermal conductance and electric insulation (resistivity is approximately $10^{13}$ Ω-cm) features. In this embodiment, the first mixed layer 510 is formed between the substrate 200 and the LED chip 400 whereby the LED chip 400 is secured on the substrate 200 by the adhesive features. In addition, thermal conductance enables the heat conducted from the LED chip 400 to be transferred through the substrate 200 to the base 100 from which the heat is dissipated. Compared with the conventional silver paste or transparent insulating paste with only adhesive features, the heat dissipation efficiency is raised through the first mixed layer 510.

Figure 2:
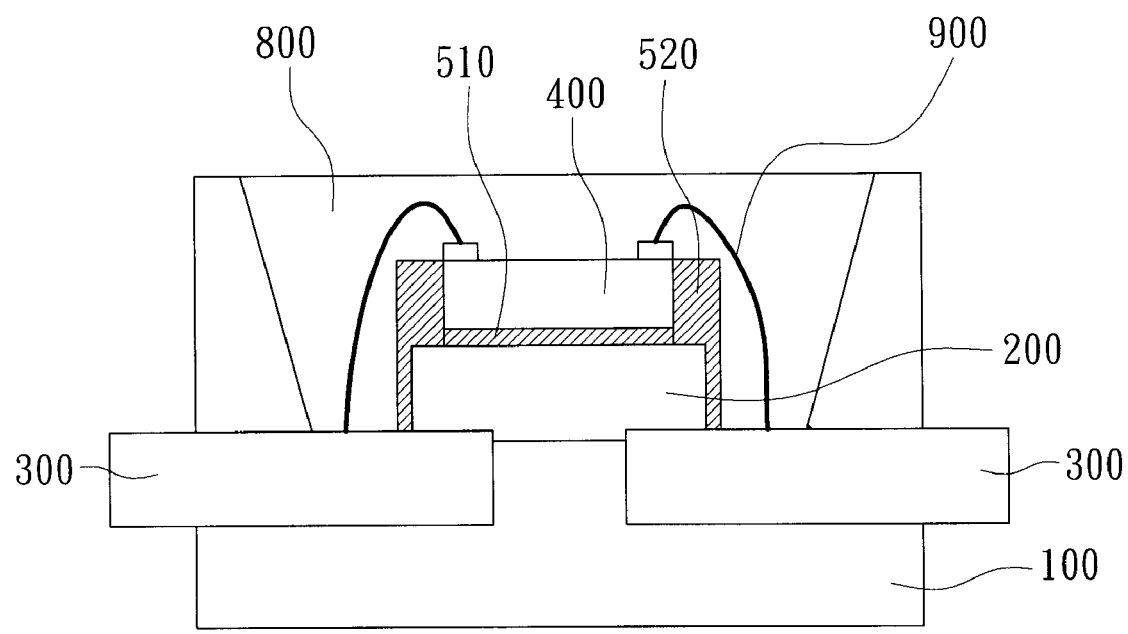
FIG. 2 is a structure view of a light emitting diode device of the second embodiment in accordance with the present invention.

Refer to FIG. 2. FIG. 2 illustrates a structure view of a light emitting diode device of the second embodiment in accordance with the present invention. The difference between the first embodiment and the second embodiment is that the light emitting diode device of the second embodiment further includes a second mixed layer 520 covered on the substrate 200 and sidewalls of the LED chip 400 laterally. The ingredients of the second mixed layer 520 are identical to the ingredients of the first mixed layer 510. Compared with the first embodiment, the second mixed layer 520 enlarges the contact area between the LED chip 400 and the second mixed layer 520 to enhance the heat dissipation efficiency.

Figure 3:
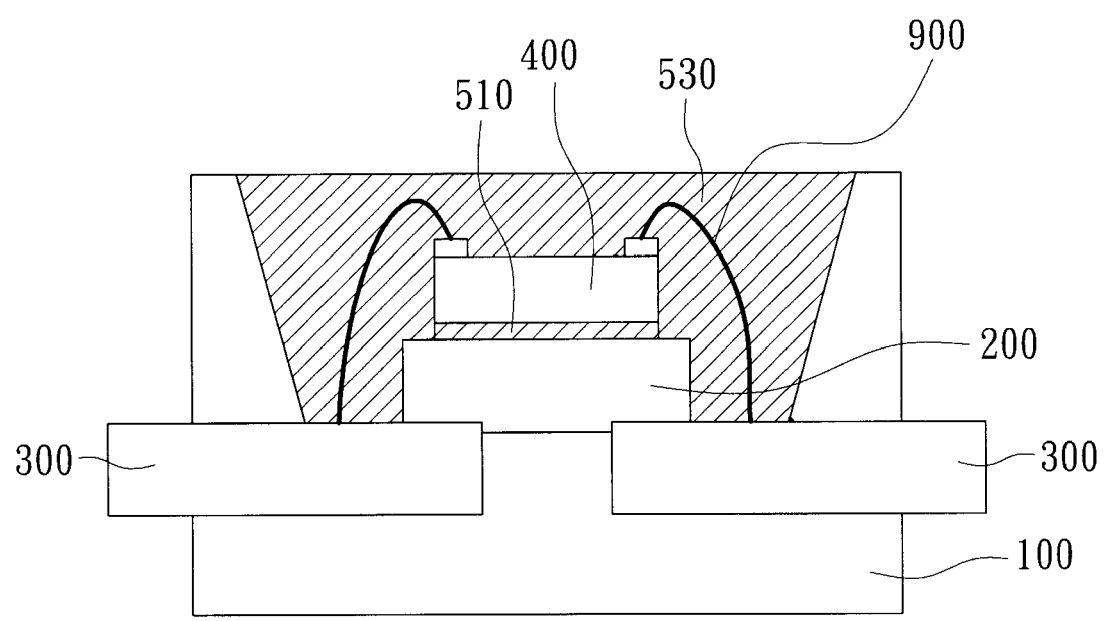
FIG. 3 is a structure view of a light emitting diode device of the third embodiment in accordance with the present invention.

Refer to FIG. 3. FIG. 3 illustrates a structure view of a light emitting diode device of the third embodiment in accordance with the present invention. The difference between the first embodiment and the third embodiment is that the light emitting diode device of the third embodiment further includes a third mixed layer 530 wherein the ingredients thereof are identical to the ingredients of the first mixed layer 510.

The third mixed layer 530 is substituted for the packaging gel 800 to cover the substrate 200, the LED chip 400 and the wires 900. The LED chip 400 illuminates upward, and the refraction index is larger than 2.5. The refraction index of the third mixed layer 530 is about between 1.5 and 2.5. Compared with the refraction index of conventional packaging gel less than 1.5, the difference between the LED chip 400 and the packaging material is decreased to widen the total internal reflection angle and enhance the light emitting efficiency.

Figure 4:
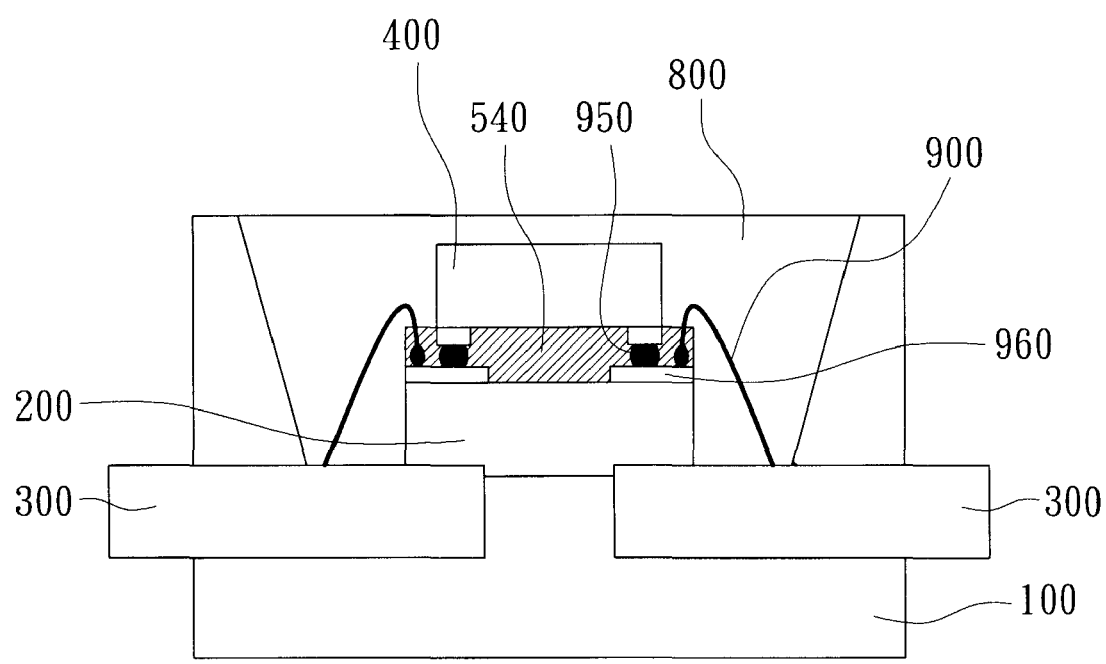
FIG. 4 is a structure view of a light emitting diode device of the fourth embodiment in accordance with the present invention.

Refer to FIG. 4. FIG. 4 illustrates a structure view of a light emitting diode device of the fourth embodiment in accordance with the present invention. In this embodiment, the LED chip 400 is mounted on the substrate through flip chip bonding technology wherein the bumps 950 are connected with the pads 960 on the substrate 200, and the pads 960 are connected with the lead frame 300 by wires 900 to provide electric conductance such that the LED chip 400 illuminates downward (flip chip type). The fourth mixed layer 540 is formed between the LED chip 400 and the substrate 200 to hold the bumps 950 and the pads 960 wherein the ingredients of the fourth mixed layer 540 are identical to the ingredients of the first mixed layer 510.

The fourth mixed layer 540 is formed between the LED chip 400 and the substrate 200 whereby the LED chip 400 is secured on the substrate 200 by the adhesive feature, and the heat radiated from the LED chip 400 is transferred through the substrate 200 to the base 100 to obtain heat dissipation by thermal conductance feature. Compared with the conventional silver paste or transparent insulating paste with only adhesive feature, the heat dissipation efficiency is raised through the fourth mixed layer 540.

Figure 5:
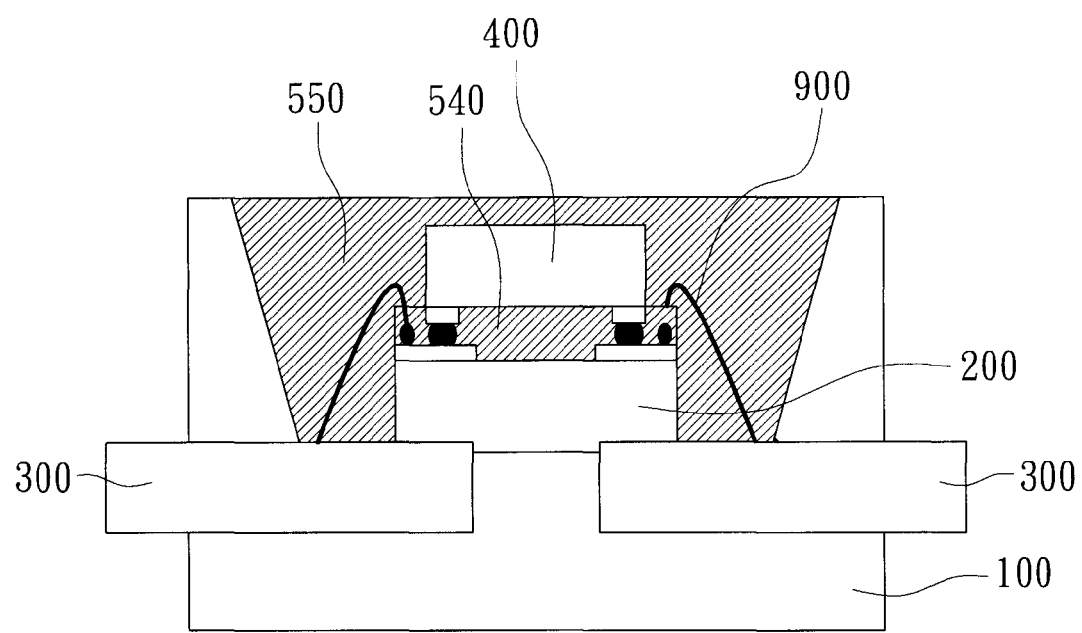
FIG. 5 is a structure view of a light emitting diode device of the fifth embodiment in accordance with the present invention.

Refer to FIG. 5. FIG. 5 illustrates a structure view of a light emitting diode device of the fifth embodiment in accordance with the present invention. The difference between the fifth embodiment and the fourth embodiment is that the light emitting diode device of the fifth embodiment further includes a fifth mixed layer 550 wherein the ingredients thereof are identical to the ingredients of the fourth mixed layer 540.

The fifth mixed layer 550 is substituted for the packaging gel 800 to cover the substrate 200, the LED chip 400 and the wires 900. The LED chip 400 illuminates downward, and the refraction index thereof is larger than 2.5. The refraction index of the fourth mixed layer 540 and the fifth mixed layer 550 is about between 1.5 and 2.5. Compared with the refraction index of conventional packaging gel less than 1.5, the difference between the LED chip 400 and the packaging material is decreased to widen the total internal reflection angle and enhance the light emitting efficiency.

As embodied and broadly described herein, the light emitting diode device of the embodiments in accordance with the present invention have the following effects:

1. The mixed layers in these embodiments are made of glue and thermal conductance insulating material to substitute for silver paste or transparent insulating paste to secure the LED chip 400 on the substrate 200. In addition, the thermal conductance of the mixed layers enables heat produced by the LED chip 400 to be transferred through the substrate 200 to the base 100 to obtain greater heat dissipation.

2. The refraction index of the mixed layers of the embodiments are about between 1.5 and 2.5, and the refraction index of the LED chip 400 is larger than 2.5. Compared with the refraction index of conventional packaging gel less than 1.5, the difference between the LED chip 400 and the packaging material is decreased to widen the total internal reflection angle and enhance the light emitting efficiency.

Although the present invention has been described in considerable detail with reference to certain preferred embodiments thereof, other embodiments are possible. Therefore, the spirit and scope of the appended claims should not be limited to the description of the preferred embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting diode device comprising:
   a substrate;
   an LED chip disposed on the substrate;
   a first material layer gluing the substrate and LED chip, wherein the first material layer comprises thermal conductance insulating material including diamond carbon, diamond-like carbon or combinations thereof;
   a second material layer covering a sidewall of the LED chip and connected to the substrate, and
   a packaging agent formed over the substrate to package the LED chip, the first material layer and the second material layer, wherein the refraction index of the second material layer is smaller than that of the LED chip and is larger than that of the packaging agent.

2. The light emitting diode device of claim 1, wherein the thermal conductance insulating material further comprises ceramic material therein.

3. The light emitting diode device of claim 2, wherein the ceramic material comprises alumina, aluminum nitride, boron nitride, silicon carbide or combinations thereof.

4. The light emitting diode device of claim 1, wherein the second material layer comprises the material including diamond carbon, diamond-like carbon, ceramic material or combinations thereof.

5. The light emitting diode device of claim 4, wherein the ceramic material comprises alumina, aluminum nitride, boron nitride, silicon carbide or combinations thereof.

6. The light emitting diode device of claim 4, wherein the packaging agent is at least one of epoxy resin, silicone resin and poly carbonate.

7. The light emitting diode device of claim 1, wherein the packaging agent is at least one of epoxy resin, silicone resin and poly carbonate.

8. The light emitting diode device of claim 1, wherein the refraction index of the LED chip is larger than 2.5, the refraction index of the second material layer is between 1.5 and 2.5, and the refraction index of the packaging agent is smaller than 1.5.

9. The light emitting diode device of claim 1, wherein the material of the first material layer is identical to the material of the second material layer.

* * * * *